US012716936B2

(12) United States Patent
Heckemann et al.

(10) Patent No.: US 12,716,936 B2
(45) Date of Patent: Aug. 25, 2026

(54) CIRCUIT WITH SWITCH FOR DISCHARGING CAPACITIVE ELEMENTS CONNECTED TO A SAFETY-RELATED DIGITAL INPUT

(71) Applicant: WAGO Verwaltungsgesellschaft mbH, Minden (DE)

(72) Inventors: Karl Heckemann, Minden (DE); Torsten Meyer, Pennigsehl (DE); Christian Voss, Minden (DE)

(73) Assignee: Wago Verwaltungsgesellschaft mbH, Minden (DE)

( * ) Notice: Subject to any disclaimer, the term of this patent is extended or adjusted under 35 U.S.C. 154(b) by 51 days.

(21) Appl. No.: 18/646,473

(22) Filed: Apr. 25, 2024

(65) Prior Publication Data

US 2024/0272223 A1 Aug. 15, 2024

Related U.S. Application Data

(63) Continuation of application No. PCT/EP2022/078752, filed on Oct. 15, 2022.

(30) Foreign Application Priority Data

Oct. 27, 2021 (DE) ..................... 10 2021 128 050.8

(51) Int. Cl.
*G01R 31/28* (2006.01)
*G01R 27/18* (2006.01)
(Continued)

(52) U.S. Cl.
CPC ......... *G01R 31/2829* (2013.01); *G01R 27/18* (2013.01); *G01R 31/50* (2020.01);
(Continued)

(58) Field of Classification Search
CPC .... G01R 31/2829; G01R 31/52; G01R 27/18; G01R 31/50; G01R 31/54; G01R 31/55; G01R 31/56
(Continued)

(56) References Cited

U.S. PATENT DOCUMENTS 10,771,080 B1 * 9/2020 Bacigalupo .......... H03K 17/567
2008/0312857 A1 12/2008 Sequine
(Continued)

FOREIGN PATENT DOCUMENTS

DE 19828058 A1 12/1999
DE 102018215536 A1 3/2020

OTHER PUBLICATIONS

International Search Report dated Jan. 25, 2023 in corresponding application PCT/EP2022/078752.

*Primary Examiner* — Raul J Rios Russo
(74) *Attorney, Agent, or Firm* — Muncy, Geissler, Olds & Lowe, P.C.

(57) ABSTRACT

A circuit is provided that has a safety-related digital input and an input circuit downstream of the safety-related digital input. The input circuit has a comparator circuit connected to the safety-related digital input and arranged to output a first value when a voltage applied to the comparator circuit is in a first range and to output a second value when the voltage applied to the comparator circuit is in a second range. The input circuit is also arranged to close a switch connected to the safety-related digital input for discharging capacitive elements in preparation for a test and to evaluate the voltage applied to the comparator circuit during the test.

14 Claims, 7 Drawing Sheets

(51) Int. Cl.
*G01R 31/50* (2020.01)
*G01R 31/52* (2020.01)
*G01R 31/54* (2020.01)
*G01R 31/55* (2020.01)
*G01R 31/56* (2020.01)

(52) U.S. Cl.
CPC .............. *G01R 31/52* (2020.01); *G01R 31/54* (2020.01); *G01R 31/55* (2020.01); *G01R 31/56* (2020.01)

(58) Field of Classification Search
USPC .......................................................... 324/509
See application file for complete search history.

(56) References Cited

U.S. PATENT DOCUMENTS

| | | | | |
|---|---|---|---|---|
| 2009/0039897 | A1* | 2/2009 | Fong | G01R 31/3167 324/537 |
| 2012/0229938 | A1* | 9/2012 | Boll | H02H 3/16 361/93.7 |
| 2014/0100675 | A1* | 4/2014 | Dold | G05B 19/0428 700/79 |
| 2020/0116785 | A1* | 4/2020 | Buelow | H03M 1/1275 |
| 2022/0050141 | A1 | 2/2022 | Rupp et al. | |
| 2022/0269846 | A1* | 8/2022 | Chonnad | G06F 30/33 |

* cited by examiner

CIRCUIT WITH SWITCH FOR DISCHARGING CAPACITIVE ELEMENTS CONNECTED TO A SAFETY-RELATED DIGITAL INPUT

This nonprovisional application is a continuation of International Application No. PCT/EP2022/078752, which was filed on Oct. 15, 2022, and which claims priority to German Patent Application No. 10 2021 128 050.8, which was filed in Germany on Oct. 27, 2021, and which are both herein incorporated by reference.

BACKGROUND OF THE INVENTION

Field of the Invention

The present invention relates to a circuit and, in particular, to a circuit which may be used in a safety-related input/output module, I/O module, which may, for example, be used in automation for providing access to field devices.

Description of the Background Art

In order to test a digital input of an I/O module, a known voltage or voltage curve may be applied to the input and the digital signal generated by the input may be compared with an expected digital signal.

SUMMARY OF THE INVENTION

It is therefore an object of the invention to provide, in an example, a circuit that comprises a safety-related digital input and an input circuit downstream of the safety-related digital input, wherein the input circuit comprises a comparator circuit which is connected to the safety-related digital input and configured to output a first value if a voltage applied to the comparator circuit is within a first range and to output a second value if the voltage applied to the comparator circuit is in a second range, wherein the input circuit is further configured to close a switch connected to the safety-related digital input for discharging capacitive elements in preparation of a test and to evaluate the voltage applied to the comparator circuit during the test.

The switch can be closed, for example, in response to a control signal that announces, causes and/or indicates the test and/or a (temporary) interruption of a signal read via the safety-related digital input during normal operation. For example, the safety-related digital input and the output can be configured to be connected to a field device. For example, the output can be connected to the safety-related digital input via a sensor or an actuator and the voltage applied to the safety-related digital input may characterize a measurement value of the sensor or a state of the actuator. During the test, for example, it may be checked whether the voltage applied to the safety-related digital input drops to zero if the output of the second voltage at the output ceases.

In this regard, the term "input" or the term "output", can be understood, for example, as referring to electrical ports, such as connectors. A connector may, for example, be based on two conductors which are electrically connected to each other via a clamping point created by a spring element (e.g. via a clamping point created by a cage clamp). Furthermore, the term "safety-related" can be understood, for example, as referring to the presence of a measure for revealing errors, such as redundant channels, or mechanisms for error detection, such as read-back circuits.

Furthermore, the term "circuit", can be understood, for example, as referring to a combination of electrical and electronic components which form a functional unit. Furthermore, the term "digital signal" can be understood, for example, as referring to a signal which assumes discrete values (wherein each discrete value is associated with a contiguous analog range). In this regard, the term "digital input" can be understood, for example, as referring to an input which serves, and is configured to, read a digital signal.

Furthermore, the term "capacitive element" can be understood, for example, as referring to any electronic or electrical component which has a non-negligible capacitance, and which must be discharged before the test is carried out. Furthermore, the term "switch" can be understood, for example, as referring to an electronic switch which, depending on the state of the switch, connects or disconnects two switch terminals to/from each other.

The closed switch may connect the safety-related digital input to ground.

A resistor may be arranged between the safety-related digital input and a node via which the safety-related digital input is connected to the comparator circuit and the switch.

The resistor may enable a test to be carried out in respect of internal error sources if an external voltage applied to the digital input cannot be switched off. In this case, the switch may be closed, and it may be checked whether a voltage change, which is to be expected if the switch is closed, is detected by the comparator circuit. The resistor may also protect the switch by limiting the current flow across the switch to a current value that is within a range of values for which the switch is designed.

The circuit may further comprise an output and an output circuit upstream of the output, wherein the circuit is configured to output a clock signal at the output.

The voltage applied to the safety-related digital input may be controlled by the clock signal output at the output.

The input circuit may be configured to close the switch connected to the safety-related digital input when the output of a voltage at the output is interrupted by the output circuit.

The input circuit may comprise one or more microcontrollers that coordinate the interruption of the output of the second voltage at the output and the closing of the switch associated with the safety-related digital input.

The input circuit may be configured to open the switch connected to the digital input again after a predetermined time interval.

The input circuit may be configured to keep the switch, which is connected to the safety-related digital input, open during the test.

The input circuit may comprise two microcontrollers which are configured to read the value output by the comparator circuit and compare it, during the test, with an expected value or value range.

The input circuit may be configured to repeat the test cyclically.

The safety-related digital input may be an input of an input/output module, I/O module.

The I/O module may further comprise a housing that is designed for mounting the I/O module in series to a further I/O module or to a head station. The I/O module may also comprise an interface that is configured to exchange data with the further I/O module or the head station. The inputs and/or outputs of the I/O module may be configured to read status signals and/or output control signals. The I/O module may be configurable with regard to deriving the data from the status signals or deriving the control signals from the data. The I/O module may further comprise a memory in which data may be stored from which the configuration of the I/O module may be derived.

In this regard, the term "I/O module" can be understood, for example, as referring to a device that can be mounted in series or is mounted in series during operation to a head station, which connects one or more field devices to the head station and optionally (via the head station) to a higher-level control unit. Furthermore, the term "head station" can be understood, for example, as referring to a component of a modular fieldbus node (a fieldbus system) whose task is to make the data and/or services of the I/O modules mounted in series to the head station available via the fieldbus to which the head station is connected.

The head station and the I/O module can be arranged to exchange data via electrical signals via a wired transmission link (in particular a local bus). The term "local bus" can be understood, for example, as referring to a bus via which (only) the I/O modules mounted in series to the head station are (directly) connected to each other or to the head station. In this regard, the term "interface" can be understood, for example, as referring to a bus interface which is configured to be connected to the local bus.

Furthermore, the term "housing" can be understood, for example, as referring to a structure formed from a solid insulating material in which conductive structures are embedded, wherein the housing typically is designed in such a way that an accidental contact with current-carrying conductors is prevented. In this regard, the term "mounting in series" can be understood, for example, be understood, in particular, as referring to the establishment of a frictional or form-fitting connection between housings, via which several modules may be connected to one another in series.

Furthermore, the term "module" can be understood, for example, as referring to a device which may be connected to another device in order to expand the capabilities of the latter, wherein the device may be configured to have its capabilities expanded by a plurality of modules. Furthermore, the term "processor" can be understood, for example, as referring to an electronic device for processing machine-readable instructions. Furthermore, the term "memory" can be understood, for example, as referring to an electronic device for storing and providing data at a later time.

Furthermore, the phrase "information relating to a configuration" can mean, for example, information indicating how to generate process mappings (e.g. how to derive data from signals read at the inputs of the I/O module and how to transmit the data to the head station via the local bus/bus) and/or how to derive signals (which for example are output at the outputs of the I/O module) from data transmitted from the head station to the I/O module via the local bus.

For example, field devices that provide status signals or process control signals may be connected to the inputs and/or outputs. In this regard, the term "field device" can be, for example, sensors and/or actuators connected (in terms of signal technology) to the I/O module.

The I/O module may be included in a system (e.g. a fieldbus system) together with a sensor connected to the safety-related digital input.

A method according to the invention for checking a safety-related digital input of the circuit comprises performing a first test with respect to internal error sources and performing a second test with respect to internal and external error sources.

The first test comprises actively discharging the line between the resistor and the comparator circuit by closing the switch which is preferably connected to ground, evaluating the voltage applied to the comparator circuit when the switch is closed and generating a first error signal if the evaluation shows that the voltage is outside a first tolerance range.

The second test comprises temporarily reducing a voltage read via the safety-related digital input, actively discharging capacitive elements connected to the safety-related digital input by closing the switch which is preferably connected to ground, opening the switch, evaluating the voltage applied to the comparator circuit when the switch is open and generating a second error signal if the evaluation shows that the voltage is outside a second tolerance range, which may coincide with the first tolerance range or differ from the first tolerance range.

It should be understood that, in principle, all steps carried out by (or using) the circuit can be understood as steps of the method and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
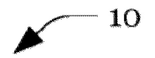
FIG. 1 schematically shows a fieldbus system.
Figure 1:
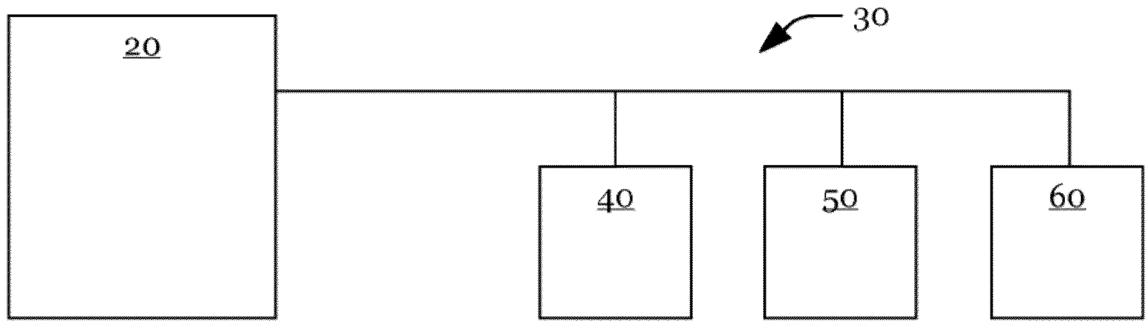

FIG. 1 shows a block diagram of a fieldbus system 10. The fieldbus system 10 comprises fieldbus nodes 20, 40, 50 and 60, which are connected to each other via fieldbus 30. Fieldbus node 20 is designed as a higher-level control unit and can be used both for monitoring and for controlling an installation that is controlled by fieldbus system 10. When the higher-level control unit 20 monitors an installation, the higher-level control unit 20 can receive status data, which describe the status of the installation, from fieldbus nodes 40, 50 and 60 cyclically or acyclically and generate an error signal or an alarm signal if the status of the installation deviates (substantially) from a desired/permitted status or status range. If the higher-level control unit 20 (not only monitors, but also) controls the installation, higher-level control unit 20 can receive status data cyclically or acyclically from fieldbus nodes 40, 50 and 60 and, taking the status data into account, determine control data that are transmitted to fieldbus nodes 40, 50 and 60.

Figure 2:
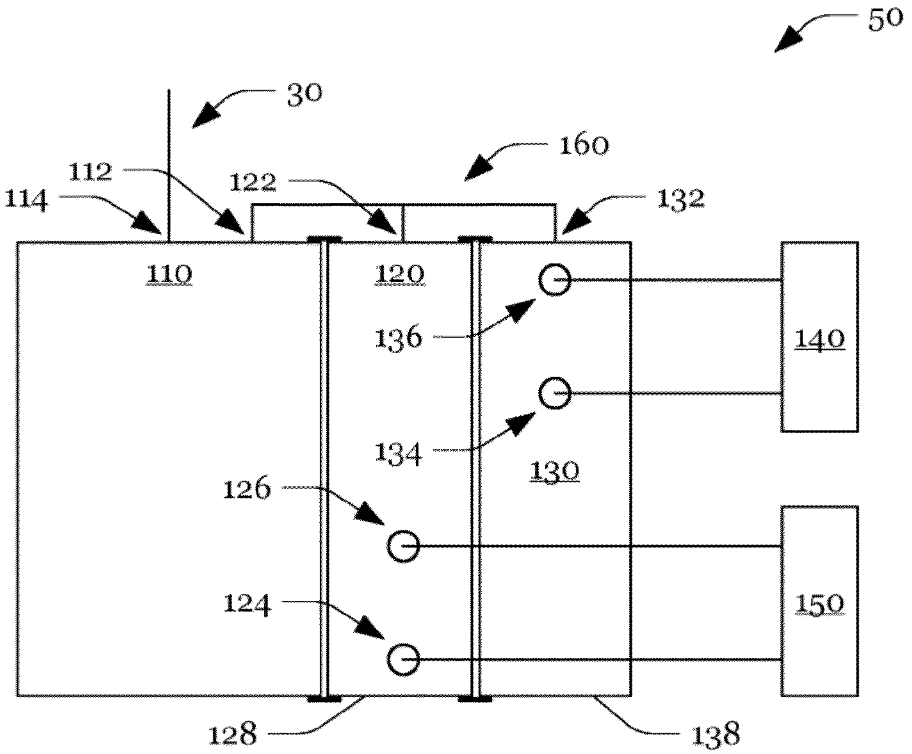
FIG. 2 schematically shows a fieldbus node.

FIG. 2 shows modular a fieldbus node 50, formed of a module 110 (head station) and two I/O modules 120 and 130 which is mounted in series to head station 110 and to which field devices 140 and 150, such as sensors and actuators, are connected. During operation, I/O module 130 reads sensor signals via input 136 and generates status data from the sensor signals, which are transmitted to head station 110 via interface 132, local bus 160 and interface 112. In addition to (fieldbus) interface 114, the head station 110 may comprise a processor and a memory in which information regarding a configuration of head station 110 is stored. The information regarding the configuration of head station 110 may, for example, specify which or how many I/O modules are mounted in series to head station 110 and how head station 110 should handle the received status data. Head station 110 may, for example, process the status data locally and/or forward it (possibly in modified form) via interface 114 and fieldbus 30 to the higher-level control unit 20. The higher-level control unit 20 (or, in the case of local processing, head station 110) may then generate control data, taking into account the status data.

The control data generated by the higher-level control unit 20 may then be transmitted to head station 110 via fieldbus 30. The control data transmitted to head station 110 (or generated by head station 110) are then forwarded/transmitted (possibly in modified form) to I/O module 120. I/O module 120 receives the control data and outputs control signals corresponding to the control data to output 124, to which actuator 150 is connected. The communication of data between the components of field bus system 10 and the mapping of sensor signals to status data and the mapping of control data to control signals may in this case be adapted to different application scenarios by configuring field bus nodes 50.

Figure 3:
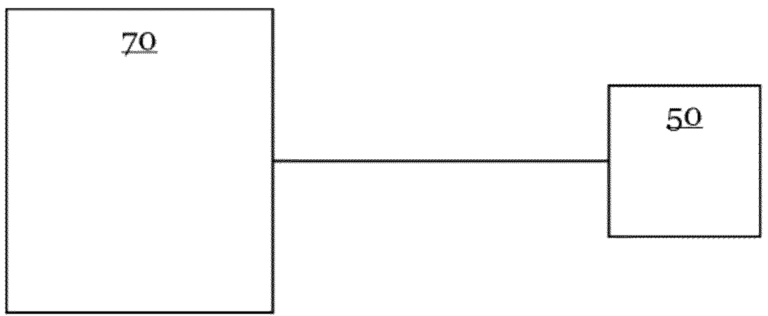
FIG. 3 shows the configuration of the fieldbus node via a computer connected to the fieldbus node.

FIG. 3 shows fieldbus node 50 and a computer 70 (e.g. a desktop, a laptop, a tablet, etc.) which is connected to fieldbus node 50 and is configured to configure I/O module 120 and I/O module 130 of fieldbus node 50. Here, computer 70 may be used solely or predominantly for configuration and may also perform other tasks (in addition to configuration). In particular, computer 70 may be part of the higher-level control unit 20 and, in addition to configuration, may also perform monitoring and/or control tasks. For example, computer 70 may monitor the installation and be configured to switch from one operating mode to another operating mode if certain conditions are met (and to change or update the configuration in the course of the switchover, if necessary).

Figure 4:
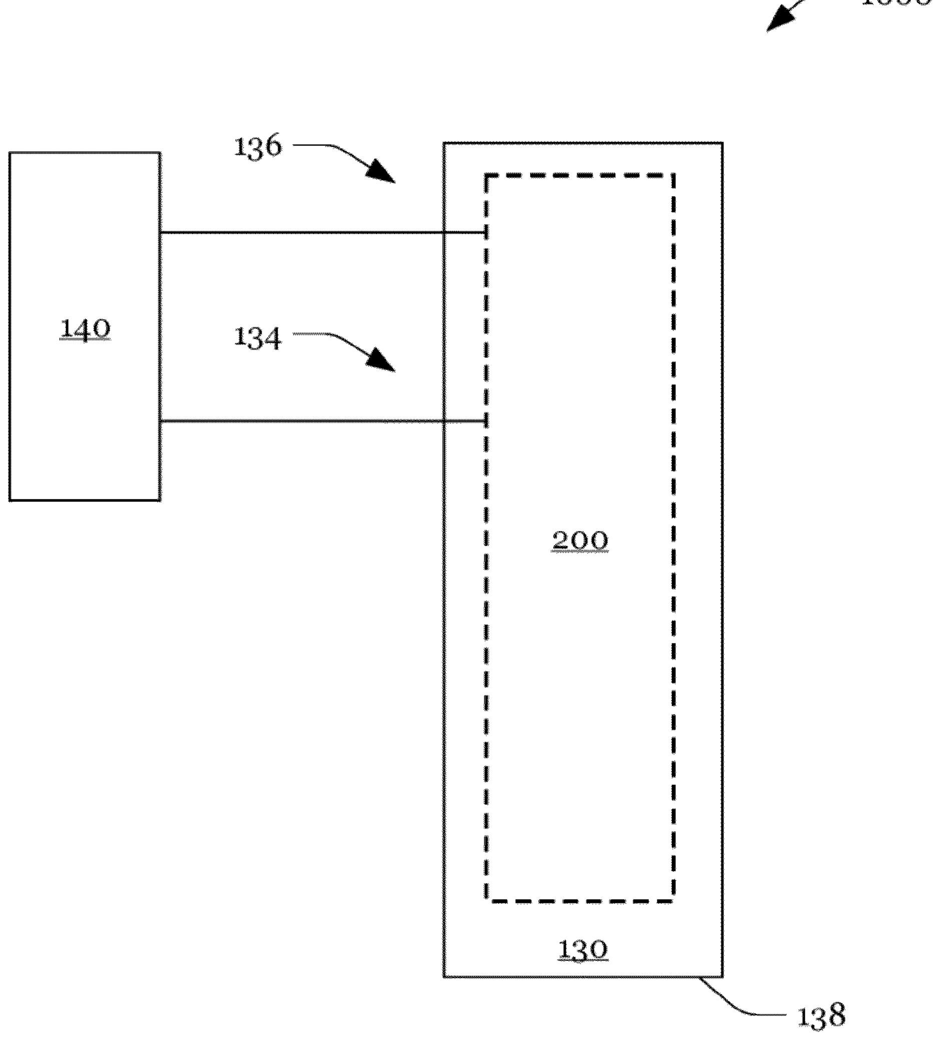
FIG. 4 shows a block diagram of a system comprising an I/O module and a sensor connected to the I/O module.

FIG. 4 schematically illustrates a system 1000. System 1000 includes an I/O module 130 and a sensor 140 which is connected to circuit 200 of I/O module 130. Sensor 140 is supplied with power by a voltage U2 output at output 136 and/or derives a voltage U1 from voltage U2, which represents a measured value (sensor signal). The voltage U2 output at output 136 of I/O module 130 is thus converted to a voltage U1 at input 134. For example, sensor 140 may map an ambient value to voltage U1, wherein U1 (substantially) corresponds to U2 if the ambient value is in a first range, and is (substantially) zero if the ambient value is in a second range (for example, sensor 140 may be a scanning device). Input 134 is provided to convert voltage U1 to a digital value. For example, the input may be provided to convert U1 to the digital value "0" when U1 is below G1 ("low level"), and to convert U1 to the digital value "1" when U1 is above G2 ("high level").

Figure 5:
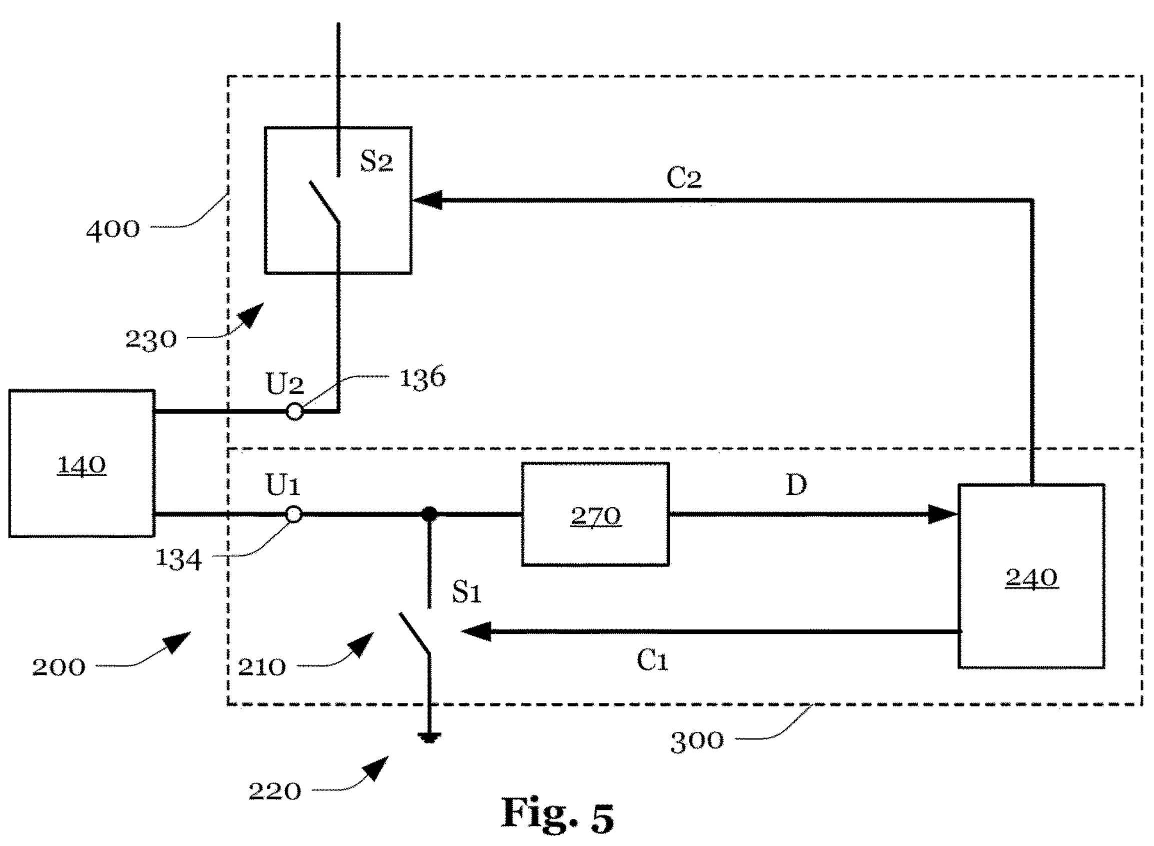
FIG. 5 shows an output circuit and an input circuit of the I/O module shown schematically in FIG. 4.

As shown in FIG. 5, I/O module 130 comprises an input circuit 300 and an output circuit 400. Output circuit 400 comprises a switch 230 which allows reducing the voltage U2 output at output 136 for a test (e.g. to zero). Input circuit 300 is configured to close switch 210 connected to input 134 for discharging capacitive elements connected to input 134 in preparation for the test. Input circuit 300 further comprises a circuit 240 which controls switch 210 and switch 230 via a control signal C1 and a control signal C2, respectively, and evaluates a digital signal D output by a comparator circuit 250 during the test. Comparator circuit 250 may, for example, map the voltage U1 applied to the comparator circuit to a low level or a high level.

Figure 6:
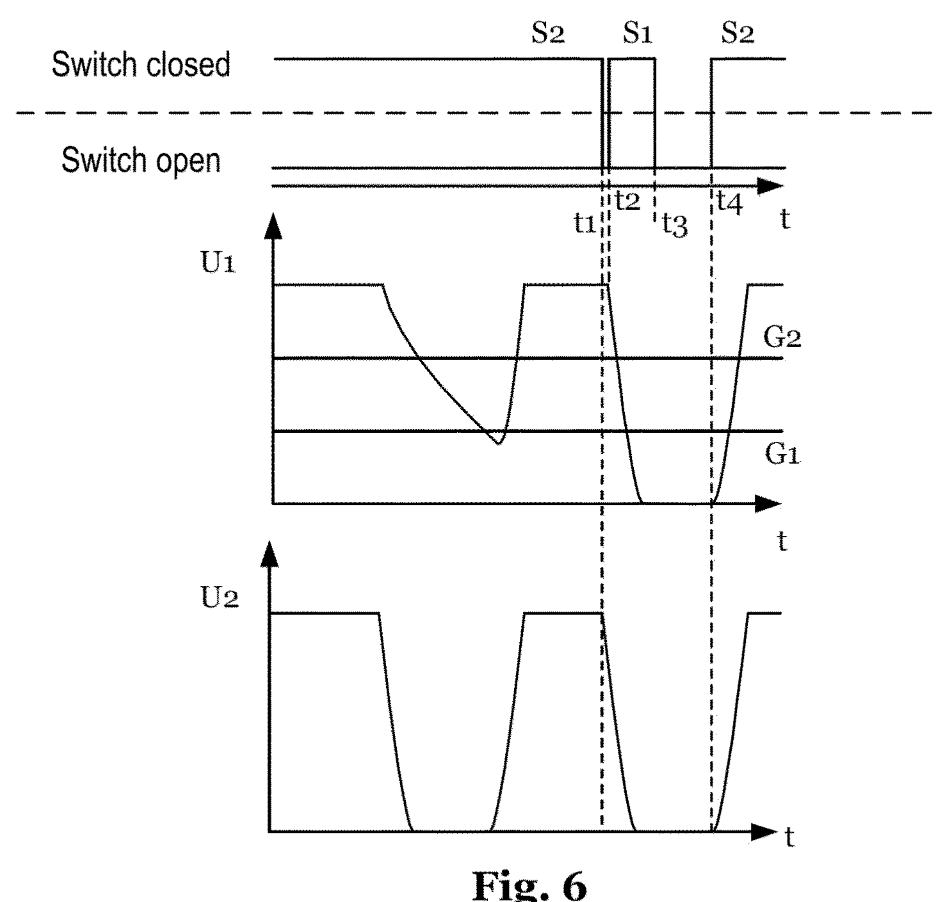
FIG. 6 shows voltage curves and switch states in the circuits shown schematically in FIG. 5 during a test of the sensor connected to the I/O module.

As illustrated in FIG. 6, the output of U2 at output 136 is interrupted during the test at time t1 via switch 230. By interrupting the output of U2 at output 136, U1 also returns to zero (if there is no error). In order to reduce the time required for the test (during which no measurement signal can be read), input 134 is connected to ground 220 via switch 210, so that by closing switch 210 at time t2 all capacitive elements connected to input 134 (such as lines, capacitors, etc. connected to connection 134) are actively discharged in preparation for the test. Without active discharging, the drop from U1 to zero would only occur with a significant delay, which would either make the test longer or reduce the error detection rate.

After active discharging, switch 210 is opened at time t3 and remains open during the test so that errors such as short circuits or conductor short circuits can be detected. For example, switch 230 may be closed for a certain time interval (t3–t2) and then opened again. If the voltage read via input 134 remains above a threshold (or outside a tolerance range) during the test, an error condition may be inferred and an error signal may be output, if necessary. If, on the other hand, the test indicates an error-free state of I/O module 130, switch 230 may be closed again at time t4, as a result of which measurement values may be read again at input 134. The test may be performed in response to a test signal or cyclically.

Figure 7:
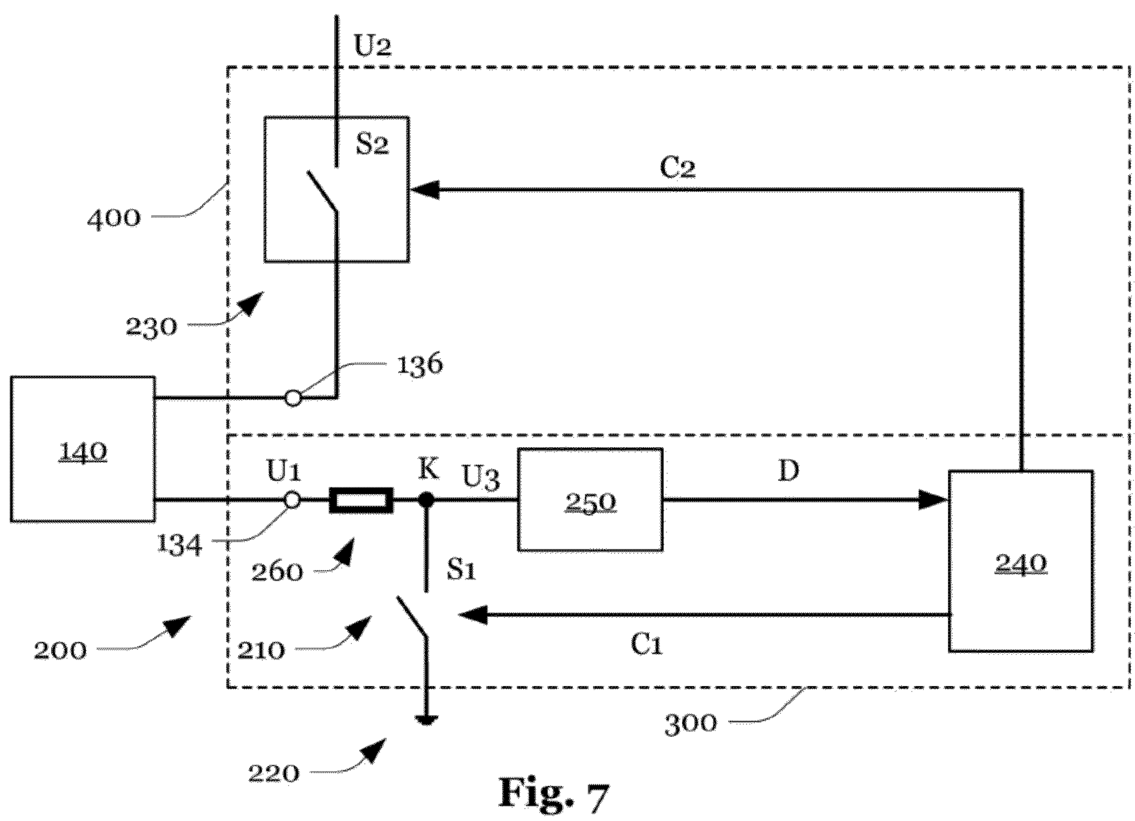
FIG. 7 shows a modification of the input circuit of the I/O module shown in FIG. 5.
Figure 8:
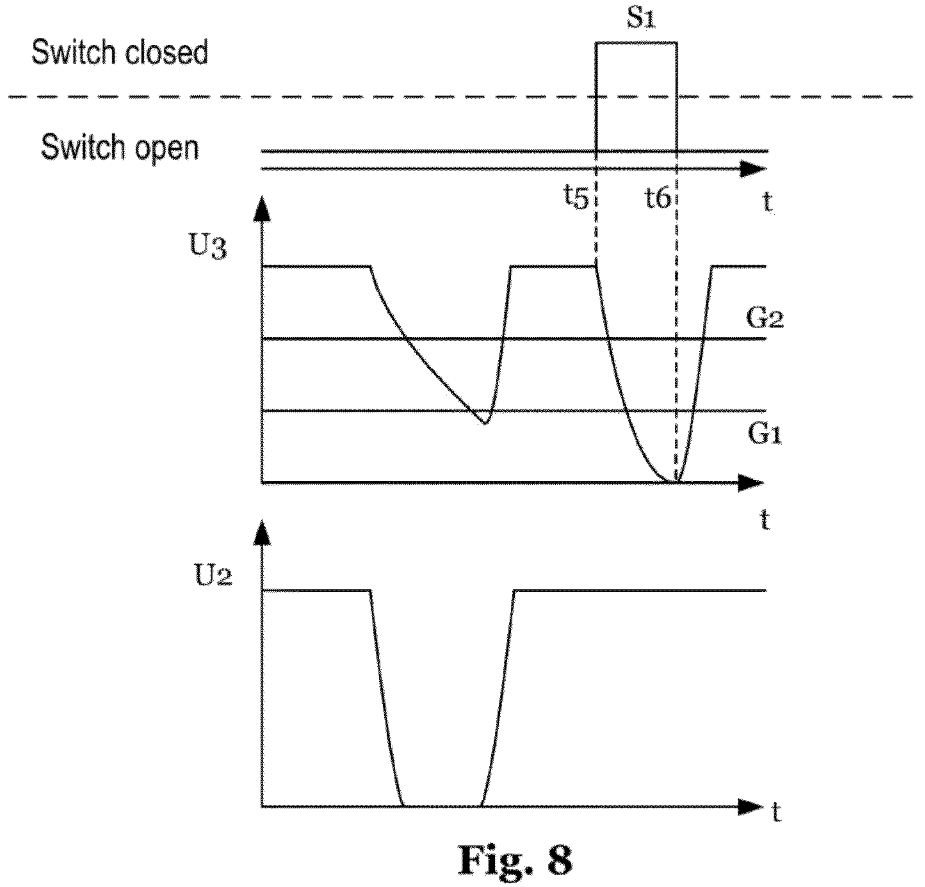
FIG. 8 shows voltage curves and switch states in the circuits shown schematically in FIG. 7 when carrying out a test with respect to external error sources.

As shown in FIG. 7, a resistor 260 may be arranged between input 134 and node K via which input 134 is connected to comparator circuit 250 and switch 210. Resistor 260 enables a test to be performed with respect to internal error sources if the voltage U1 applied to input 134 cannot be reduced. As illustrated in FIG. 8, switch 210 is closed at time t5 during the test. If the voltage U3 applied to comparator circuit 250 remains above a threshold (or outside a tolerance range) during the test, an error condition may be inferred, and an error signal may be output. If, on the other hand, the test indicates an error-free state of I/O module 130, switch 210 may be closed again at time t6, as a result of which measurement values may be read again via input 134. This test, too, can be performed in response to a test signal or cyclically.

Figure 9:
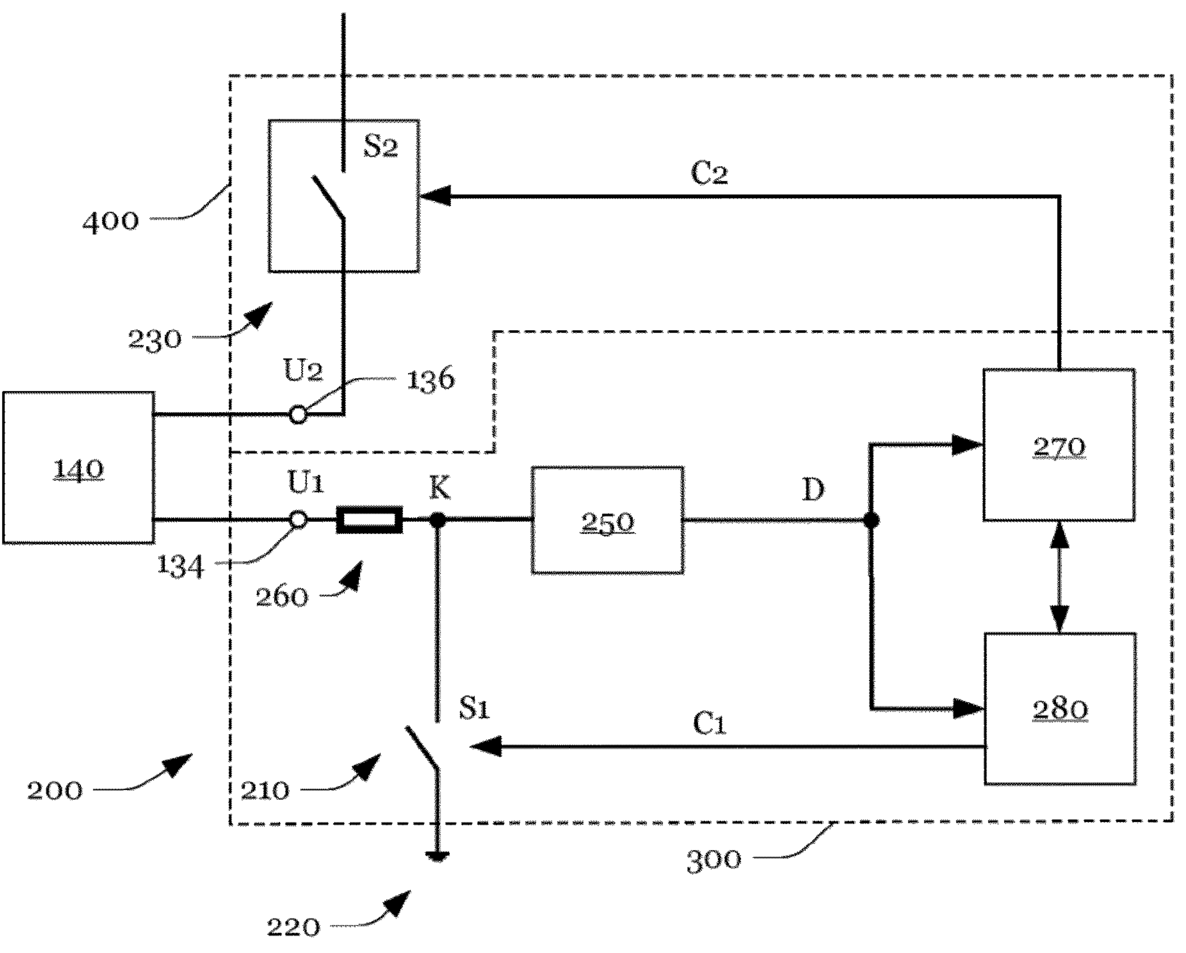
FIG. 9 shows a modification of the input circuit of the I/O module shown in FIG. 7.

Circuit 240 may further comprise two microcontrollers 270 and 280, as shown in FIG. 9. Microcontrollers 270 and 280 may perform redundant operations and check each other's calculations/states via cross communication and also coordinate the opening and closing of switch 210 and switch 230.

Figure 10:
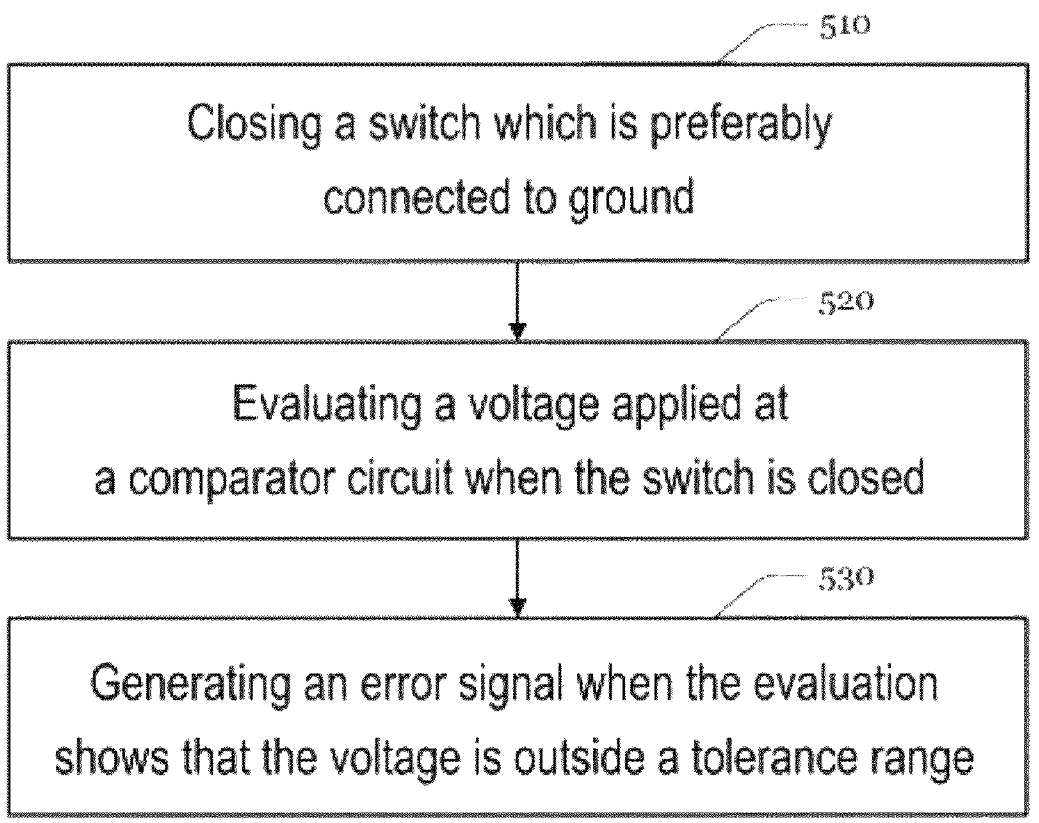
FIG. 10 shows a flowchart of a first test for checking a digital input of the I/O module.

FIG. 10 shows a flowchart of the test with regard to internal error sources. The process starts at 510 with closing switch 210. Then, a voltage applied to comparator circuit 250 is evaluated at 520 (with the switch closed). Then, an error signal is generated at 530 if the evaluation shows that the voltage is outside a tolerance range around an expected value.

Figure 11:
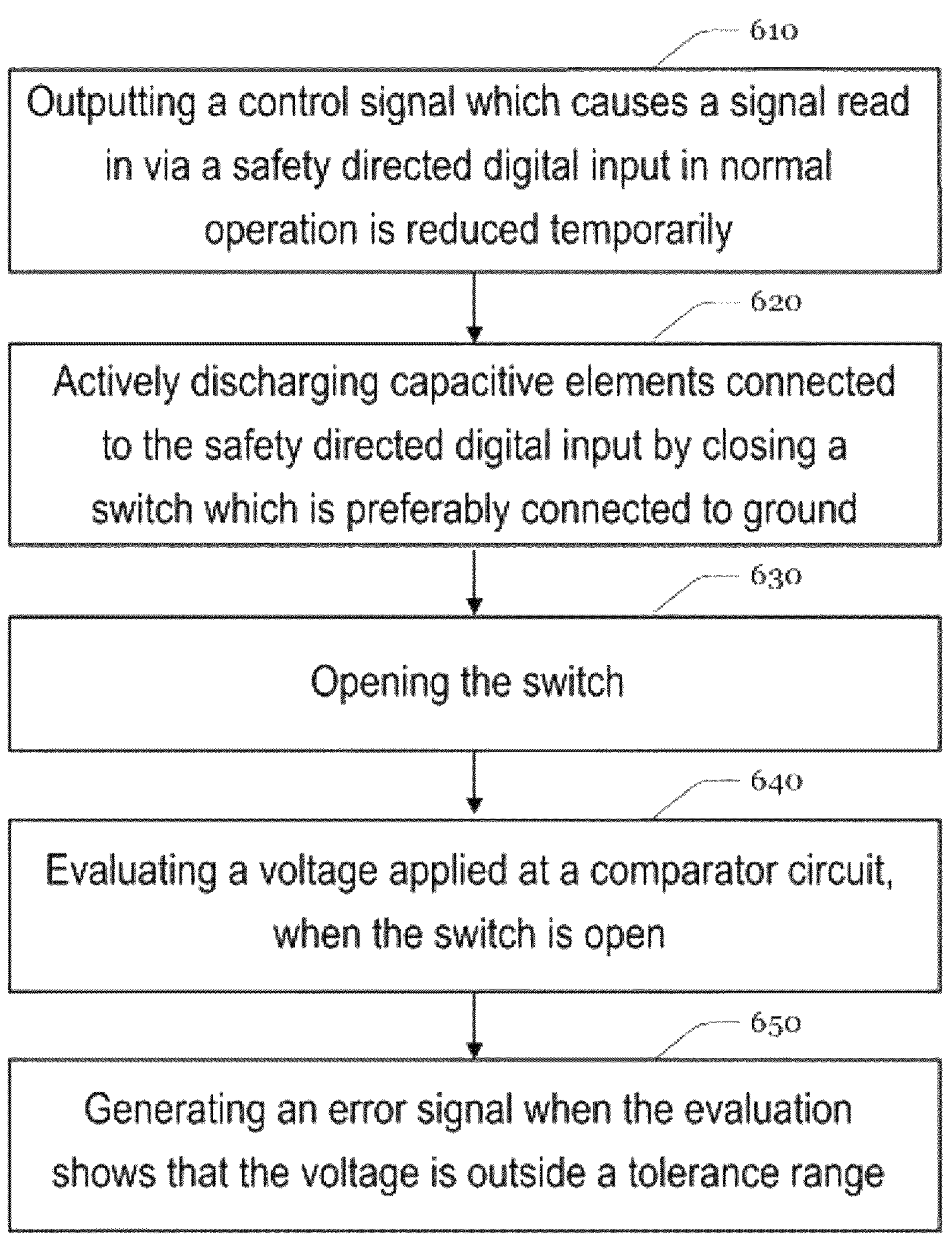
FIG. 11 shows a flowchart of a second test for checking the digital input of the I/O module.

FIG. 11 shows a flowchart of the test with regard to external error sources. The process starts at 610 with the output of a control signal which causes the signal U1 read via input 134 in normal operation to be temporarily interrupted. At 620, the capacitive elements connected to input 134 are actively discharged by closing switch 210, which is preferably connected to ground. Then, switch 210 is opened again at 630 and a voltage U1 applied to input 134 is evaluated at 640 (with the switch opened). An error signal is then generated at 650 if the evaluation shows that the voltage is outside the tolerance range.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:

a safety-related digital input;

an input circuit arranged downstream of the safety-related digital input, the input circuit comprising a comparator circuit that is connected to the safety-related digital input and configured to output a first value if a voltage applied to the comparator circuit is in a first range and to output a second value if the voltage applied to the comparator circuit is in a second range;

an output; and an output circuit arranged upstream of the output, wherein the input circuit is further configured to close a switch connected to the safety-related digital input to discharge capacitive elements in preparation of a test and to evaluate the voltage applied to the comparator circuit during the test, wherein the circuit is configured to output a voltage at the output, wherein a voltage applied to the safety-related digital input is controlled by the voltage output at the output, and during the test, it is checked whether the voltage applied to the safety-related digital input drops to zero when the output of the voltage at the output is interrupted by the output circuit.

2. The circuit of claim 1, wherein the closed switch connects the safety-related digital input to ground.

3. The circuit of claim 1, wherein a resistor is arranged between the safety-related digital input and a node, and wherein the resistor connects the safety-related digital input to the comparator circuit and the switch.

4. The circuit of claim 1, wherein the input circuit is configured to close the switch connected to the safety-related digital input if the output of a voltage at the output is interrupted by the output circuit.

5. The circuit of claim 4, wherein the input circuit comprises one or more microcontrollers that coordinate the interruption of the output of the second voltage at the output and the closing of the switch connected to the safety-related digital input.

6. The circuit of claim 4, wherein the input circuit is configured to open the switch connected to the safety-related digital input again after a predetermined time interval.

7. The circuit of claim 1, wherein the input circuit is configured to keep the switch, which is connected to the safety-related digital input, open during the test.

8. The circuit of claim 1, wherein the input circuit comprises two microcontrollers configured to read the value output by the comparator circuit and to compare it, during the test, with an expected value or range of values.

9. The circuit of claim 1, wherein the input circuit is configured to repeat the test cyclically.

10. A safety-related input/output module comprising a circuit according to claim 1, wherein the safety-related digital input is an input of the safety-related input/output module.

11. A system comprising:

a safety-related input/output module according to claim 10; and a sensor connected to the safety-related digital input.

12. A method for checking a safety-related digital input of a circuit according to claim 3, the method comprising:

performing a first test with respect to internal error sources; and performing a second test with respect to internal and external error sources, wherein the first test comprises:

closing the switch that is connected to ground;

evaluating the voltage applied to the comparator circuit when the switch is closed; and generating a first error signal if the evaluation indicates that the voltage is outside a first tolerance range; and wherein the second test comprises:

temporarily reducing a voltage read via the safety-related digital input;

actively discharging capacitive elements connected to the safety-related digital input by closing the switch that is connected to ground;

opening the switch;

evaluating the voltage applied to the comparator circuit when the switch is open; and generating a second error signal if the evaluation indicates that the voltage is outside a second tolerance range, that coincides with the first tolerance range or differs from the first tolerance range.

13. The circuit of claim 1, wherein the output circuit comprises a switch configured to reduce the voltage output at the output for the test.

14. The circuit of claim 3, wherein the resistor enables a test to be performed with respect to internal error sources if the voltage applied to the safety-related digital input cannot be reduced.

* * * * *